(12) United States Patent
Endler et al.

(10) Patent No.: US 8,257,841 B2
(45) Date of Patent: Sep. 4, 2012

(54) BODIES COATED WITH A HARD MATERIAL AND METHOD FOR THE PRODUCTION THEREOF

(75) Inventors: Ingolf Endler, Coswig (DE); Mandy Hoehn, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 332 days.

(21) Appl. No.: 12/734,198

(22) PCT Filed: Oct. 10, 2008

(86) PCT No.: PCT/EP2008/063583
§ 371 (c)(1),
(2), (4) Date: Apr. 16, 2010

(87) PCT Pub. No.: WO2009/050110
PCT Pub. Date: Apr. 23, 2009

(65) Prior Publication Data
US 2010/0233511 A1     Sep. 16, 2010

(30) Foreign Application Priority Data
Oct. 16, 2007 (DE) .......................... 10 2007 000 512

(51) Int. Cl.
*B32B 9/00* (2006.01)
*C23C 16/34* (2006.01)
(52) U.S. Cl. ... 428/697; 428/698; 428/699; 427/255.23; 427/255.28; 427/255.394
(58) Field of Classification Search .................. 427/446, 427/255.23, 255.28, 255.39, 255.371, 255.394; 428/697, 698, 699
See application file for complete search history.

(56) References Cited

U.S. PATENT DOCUMENTS
5,679,448 A  10/1997 Kawata
(Continued)

FOREIGN PATENT DOCUMENTS
DE    44 08 250    1/1995
(Continued)

OTHER PUBLICATIONS
Lee et al "(Ti (1-x)Al(x)N coatings by plasma-enhanced chemical vapor depostion" J.Vac. Sci. Technol A12(4) Jul./Aug. 1994 p. 1602-1607.*

(Continued)

*Primary Examiner* — Archene Turner
(74) *Attorney, Agent, or Firm* — Collard & Roe, P.C.

(57) ABSTRACT

The invention relates to bodies coated with a hard material, comprising a multi-layer coating system containing at least one $Ti_{1-x}Al_xN$ hard material coating and to a multi-stage CVD method for producing the bodies. The aim of the invention is to achieve excellent adhesion of the $Ti_{1-x}Al_xN$ hard material coating in bodies coated with a hard material comprising a multi-layer coating system containing at least one $Ti_{1-x}Al_xN$ hard material coating and a high degree of wear resistance. According to the invention, the bodies coated with a hard material comprising a multi-layer coating system containing at least one $Ti_{1-x}Al_xN$ hard material coating are characterized by the following features: the coating system consists of a) a bonding coating applied to the body, consisting of TiN, Ti(C,N) or TiC; b) a phase gradient coating that is applied to the bonding coating; and c) the single or multi-phase $Ti_{1-x}Al_xN$ hard material coating or coatings applied to the phase gradient coating. The phase gradient coating consists of a TiN/h-AlN phase mixture on the side facing the bonding coating and has an increasing phase fraction of fcc-TiAlN with an increasing coating thickness, (the fraction being >50%), towards the $Ti_{1-x}Al_xN$ hard material coating(s) and a corresponding simultaneous decrease in the phase fractions of TiN and h-AlN. The coating according to the invention can be used in particular for tools and components consisting of steel, hard metals, cermets and ceramics, such as for example drills, milling cutters and indexable cutting inserts.

10 Claims, 1 Drawing Sheet

U.S. PATENT DOCUMENTS

| | | | |
|---|---|---|---|
| 5,853,873 A * | 12/1998 | Kukino et al. | 428/699 |
| 6,040,012 A | 3/2000 | Anderbouhr et al. | |
| 6,110,571 A * | 8/2000 | Yaginuma et al. | 428/697 |
| 6,238,739 B1 | 5/2001 | Madar et al. | |
| 2009/0123779 A1 | 5/2009 | Endler | |

FOREIGN PATENT DOCUMENTS

| | | |
|---|---|---|
| DE | 699 15 866 | 1/2005 |
| DE | 10 2005 032 860 | 1/2007 |
| WO | WO 03/085152 | 10/2003 |

OTHER PUBLICATIONS

Endler, I. et al., "Aluminium-rich $Ti_{1-x}Al_xN$ coatings by CVD," PM in Belgium, A Crossroads in Industry Development: Euro PM 2006 Congress & Exhibition; Oct. 23-25, 2006, Ghent, Belgium, Proceedings, Powder Metallurgy Congress & Exhibition, European Powder Metallurgy Association, Shrewsbury, vol. 1, Oct. 25, 2006, pp. 219-224, XP008105516. (ISR—category "A").

R. Prange, Diss. RTHW Aachen, 1999, Fortschritt-Berichte VDI [Progress Reports of the Association of German Engineers], 2000, Series 5, No. 576, pp. 28-39.

C. Kyrylov et al., "Correlation between plasma conditions and properties of (Ti,Al)N coatings deposited by PECVD," Surface and Coating Technology, 151-152 (2002) pp. 359-364.

A. Hörling, L. Hultman, M. Odén, J. Sjölén, L. Karlsson, "Thermal stability of arc evaporated high aluminum-content $Ti_{1-x}Al_xN$ thin films," J. Vac. Sci. Technol. A 20(5), Sep./Oct. 2002, pp. 1815-1823.

D. Heim, R. Hochreiter, "TiAlN and TiAlCN deposition in an industrial PaCVD-plant," Surface and Coatings Technology, 98 (1998) pp. 1553-1556.

S. Anderbouhr, V. Ghetta, E. Blanquet, C. Chabrol, F. Schuster, C. Bernard, R. Madar, "LPCVD and PACVD (Ti,Al)N films: morphology and mechanical properties," Surface and Coatings Technology, 115 (1999) pp. 103-110.

S. G. Harris, E. D. Doyle, A. C. Vlasveld, J. Audy, D. Quick, A study of the wear mechanisms of $Ti_{1-x}Al_xN$ and $Ti_{1-x-y}Al_xCr_xN$ coated high-speed steel twist drills under dry machining conditions, Wear 254 (2003), pp. 723-734.

International Search Report.

* cited by examiner

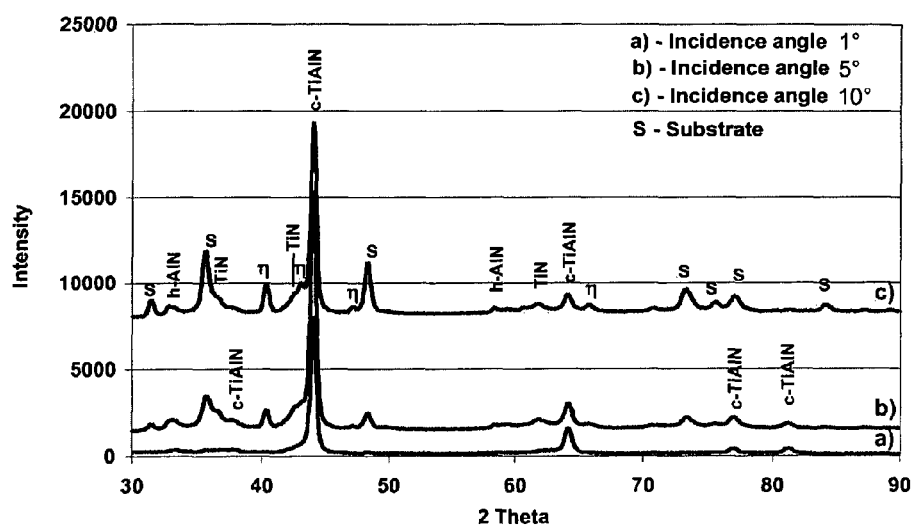

BODIES COATED WITH A HARD MATERIAL AND METHOD FOR THE PRODUCTION THEREOF

CROSS REFERENCE TO RELATED APPLICATIONS

This application is the National Stage of PCT/EP2008/063583 filed on Oct. 10, 2008, which claims priority under 35 U.S.C. §119 of German Application No. 10 2007 000 512.3 filed Oct. 16, 2007. The international application under PCT article 21(2) was not published in English.

TECHNICAL FIELD

The invention relates to hard-material-coated bodies having a multi-layer layer system that contains at least one $Ti_{1-x}Al_xN$ hard-material layer, and a method for their production. The coating according to the invention can be used, in particular, for tools made of steel, hard metals, cermets, and ceramics, such as drills, milling cutters, and cutting inserts. The bodies coated according to the invention have improved friction-wear resistance.

STATE OF THE ART

The production of friction-wear protection layers in certain regions of the material system Ti—Al—N is already known, in accordance with WO 03/085152 A2. In this connection, it is possible to produce monophase TiAlN layers having the NaCl structure, at AlN contents up to 67%. Such cubic TiAlN layers possess a relatively great hardness and friction-wear resistance. In the case of AlN contents>67%, however, a mixture of cubic and hexagonal TiAlN is formed, and at an AlN proportion>75%, only the softer hexagonal wurtzite structure, which is not resistant to friction wear, is formed.

It was also already found that monophase $Ti_{1-x}Al_xN$ hard-material layers with x up to 0.9 can be produced by means of plasma CVD (R. Prange, Diss. RTHW Aachen, 1999, Fortschritt-Berichte VDI [Progress Reports of the Association of German Engineers], 2000, Series 5, No. 576, as well as C. Kyrylov et al., Surface and Coating Techn. 151-152 (2002) 359-364). However, a disadvantage in this connection is the insufficient homogeneity of the layer composition, and the relatively high chlorine content in the layer. Furthermore, conducting the process is complicated and requires a lot of effort.

For the production of the known $Ti_{1-x}Al_xN$ hard-material layers, PVD methods or plasma CVD methods are used, according to the state of the art, which methods are operated at temperatures below 700° C. (A. Hörling, L. Hultman, M. Oden, J. Sjölen, L. Karlsson, J. Vac. Sci. Technol. A 20 (2002) 5, 1815-1823, as well as D. Heim, R. Hochreiter, Surface and Coatings Technology 98 (1998) 1553-1556). It is a disadvantage of these methods that coating complicated component geometries presents difficulties. PVD is a very targeted process, and plasma CVD requires a high level of plasma homogeneity, since the plasma power density has a direct influence on the Ti/Al atomic ratio of the layer. With the PVD methods that are almost exclusively used industrially, it is not possible to produce monophase cubic $Ti_{1-x}Al_xN$ layers with x>0.75.

Since cubic TiAlN layers are a metastable structure, production with conventional CVD methods, at high temperatures $\geq$1000° C., is fundamentally not possible, because a mixture of TiN and hexagonal AlN is formed at temperatures above 1000° C.

In accordance with U.S. Pat. No. 6,238,739 B1, it is also known that $Ti_{1-x}Al_xN$ layers with x between 0.1 and 0.6 can be obtained in the temperature range between 550° C. and 650° C., by means of a thermal CVD process, without plasma support, if a gas mixture of aluminum chlorides and titanium chlorides, as well as $NH_3$ and $H_2$, is used. The disadvantage of this special thermal CVD method also consists in the restriction to a layer stoichiometry $x \leq 0.6$ and the restriction to temperatures below 650° C. The low coating temperature leads to high chlorine contents in the layer, up to 12 at. -%, which are harmful for use (S. Anderbouhr, V. Ghetta, E. Blanquet, C. Chabrol, F. Schuster, C. Bernard, R. Madar, Surface and Coatings Technology 115 (1999) 103-110).

In order to meet the great demands as a friction-wear protection layer on tools and components, extremely good adhesion must be guaranteed. In the case of PVD-TiAlN layers, TiN is frequently used as an adhesion-improving layer. The combination of a first TiN layer with a subsequently applied TiAlN layer is described in the literature (S. G. Harris, E. D. Doyle, A. C. Vlasveld, J. Audy, D. Quick; Wear 254 (2003), p. 723-724).

Furthermore, layer systems are also known in which individual TiAlN layers having a different Ti/Al ratio are combined with one another, or a layer having a Ti/Al concentration gradient is produced, Thus, in DE 44 08 250 C2, a combination of two TiAlN layers having a different composition is described, in order to achieve better adhesion. In this connection, two TiAlN layers are applied by means of plasma-supported CVD deposition, whereby the first, titanium-rich layer is deposited directly onto the substrate, and the second layer, which has a higher Al content, is disposed on the first layer. Alternatively, a TiAlN layer is produced, in which Ti and Al are present in a gradually changing composition. From the boundary surface between substrate and layer, in the direction of the surface of the film, the Ti content gradually decreases, and the Al content gradually increases.

Layers and multi-layer layers of $Ti_{1-x}Al_xN$, in which the layers have a continuous concentration gradient of the Al, which are produced by means of CVD or PACVD, are also known (U.S. Pat. No. 6,040,012; DE 699 15 866 T2). These $Ti_{1-x}Al_xN$ concentration layers are restricted to an Al concentration with an x up to maximally 0.6. The limited Al content leads to an only moderate oxidation resistance, and therefore has a disadvantageous effect on the friction-wear resistance at high thermal stress during use of the tool.

Also, hard-material-coated bodies are already known, which are coated with at least one $Ti_{1-x}Al_xN$ hard-material layer produced by means of CVD, without plasma excitation, which is present as a monophase layer in the cubic NaCl structure, with a stoichiometry coefficient x>0.75, and a lattice constant $a_{fcc}$ between 0.412 nm and 0.405 nm, or which is a monophase $Ti_{1-x}Al_xN$ hard-material layer whose main phase consists of $Ti_{1-x}Al_xN$ with a cubic NaCl structure having a stoichiometry coefficient x>0.75 up to x=0.93 and a lattice constant $a_{fcc}$ between 0.412 nm and 0.405 nm (DE 10 2005 032 860 B4). In this connection, $Ti_{1-x}Al_xN$ in the wurtzite structure and/or as $TiN_x$ in the NaCl structure is contained as an additional phase. These hard-material-coated bodies demonstrate good friction-wear resistance and oxidation resistance.

In the case of TiAlN layers that are produced by means of thermal CVD, at clearly higher temperatures in the range between 700° C. and 900° C., only the TiN intermediate layer that was already mentioned above has been described (I. Endler, M. Herrman, M. Naupert, R. Pitonak, M. Schneider, H. van den Berg, H. Westphal; Proceedings Euro PM2006, Ghent, Belgium, Oct. 23-25, 2006, Vol. 1, p. 219-224).

DISCLOSURE OF THE INVENTION

The invention is based on the task of achieving very good adhesion of the $Ti_{1-x}Al_xN$ hard-material layer, at great friction-wear resistance, in the case of hard-material-coated bodies having a multi-layer layer system that contains at least one $Ti_{1-x}Al_xN$ hard-material layer.

This task is accomplished with the characteristics of the claims.

The hard-material-coated bodies according to the invention, having a multi-layer layer system that contains at least one $Ti_{1-x}Al_xN$ hard-material, are characterized in that the layer system consists of
   a) a bonding layer of TiN, Ti(C,N) or TiC applied to the body,
   b) a phase-gradient layer applied to the bonding layer, and
   c) the monophase or multiphase $Ti_{1-x}Al_xN$ hard-material layer(s) applied to this, whereby the phase gradient layer consists of a TiN/h-AlN phase mixture on its side that faces the bonding layer, and demonstrates an increasing phase proportion of fcc-TiAlN having a proportion of >50% in the direction toward the $Ti_{1-x}Al_xN$ hard-material layer(s), with an increasing layer thickness, and an accompanying simultaneous decrease in the phase proportions of TiN and h-AlN.

In this connection, multiphase $Ti_{1-x}Al_xN$ hard-material layers contain fcc-$Ti_{1-x}Al_xN$ as the main phase, whereby $Ti_{1-x}Al_xN$ in the wurtzite structure and/or TiN are contained as additional phases.

It is advantageous if the phase-gradient layer demonstrates a constant or almost constant content of Ti, Al, and N over its thickness.

The phase-gradient layer preferably has a thickness in the range of 0.1 μm to 5 μm, and an atomic ratio of Ti:Al in the range of 1:1 to 1:15.

The layer system that is present on the bodies, according to the invention, is characterized by a clearly higher adhesion strength in comparison with a layer system that does not contain any phase-gradient layer. The phase-gradient layer furthermore allows a good adaptation of different layer properties, such as hardness and residual stress. By means of the layer sequence according to the invention, a graduated increase in hardness is achieved, and, at the same time, a continuous transition of the residual stress state of the TiN bonding layer to the $Ti_{1-x}Al_xN$ cover layer also takes place within the phase-gradient layer. These property gradients have an advantageous effect on the friction-wear behavior, so that it was possible to achieve surprisingly large increases in the friction-wear resistance with the layer system according to the invention, as compared with layer systems according to the state of the art.

Furthermore, the layer system according to the invention, composed of phase-gradient layer and $Ti_{1-x}Al_xN$ hard-material layer, demonstrates a high Al content throughout, so that greater oxidation resistance and friction-wear resistance is achieved, as compared with the concentration gradient layers known from U.S. Pat. No. 6,040,012 and DE 699 15 866 T2.

For the production of the hard-material-coated bodies, the invention contains a method that is characterized in that first, a bonding layer of TiN, Ti(C,N), or TiC is applied to the bodies, using an industrial CVD standard process, then the phase-gradient layer is deposited onto this, and finally, in known manner, one or more monophase or multiphase $Ti_{1-x}Al_xN$ hard-material layers are deposited onto this, by means of CVD, without plasma excitation, whereby the deposition of the phase-gradient layer is carried out with a CVD process, with a continuously dropping process temperature, using a precursor mixture of $TiCl_4$, $AlCl_3$, $NH_3$ and/or hydrazine, mixed with $H_2$ and/or $N_2$.

The CVD process for deposition of the phase-gradient layer is advantageously started at a starting temperature between 900° C. and 1050° C. The process temperature is then continuously lowered, during the course of the deposition process, to a final temperature between 700° C. and 890° C.

The CVD process for deposition of the phase-gradient layer is preferably carried out during a time of 1 min to 60 min.

It is advantageous that inert rare gases can be additionally mixed into the precursor/gas mixture for deposition of the phase-gradient layer.

The CVD process for deposition of the phase-gradient layer is preferably carried out at a pressure of $10^2$ Pa to $10^5$ Pa.

The method according to the invention can be carried out in simple manner and allows adjustment of the phases that are optimal for adhesion, by means of the use of a defined temperature regime. The process step that is necessary for producing the phase-gradient layer can be integrated into the process as a whole without additional effort, and does not lead to an increase in time required for the coating process as a whole.

EMBODIMENT OF THE INVENTION

In the following, the invention will be explained in greater detail using an exemplary embodiment and the related FIG. 1, which shows an X-ray diffractogram.

The layer system according to the invention is applied to WC/Co hard metal cutting inserts, by means of CVD, in three process steps. In the first step, deposition of a high-temperature TiN layer corresponding to the state of the art takes place by means of thermal CVD. For this purpose, a gas mixture of 14 ml/min $TiCl_4$, 3000 ml/min $H_2$, and 300 ml/min $N_2$ is introduced at a temperature of 920° C. and a pressure of 9 kPa. After a coating time of 60 min, a TiN bonding layer having a thickness of 1 μm is obtained.

In the second process step, the phase-gradient layer is produced. The pressure is reduced to 0.5 kPa and the gas flows for deposition of the gradient layer are set. Feed of the gas mixture into the reactor takes place by way of two gas paths, whereby mixing of the two gas streams takes place 10 cm ahead of the coating zone. By way of the first gas channel, 7 ml/min $AlCl_3$, 4 ml/min $TiCl_4$, 500 ml/min $H_2$, and 200 ml/min Ar are metered in, and by way of the second gas feed, addition of a mixture of 50 ml/min $NH_3$ and 250 ml/min $N_2$ takes place. After this gas mixture has been adjusted, the deposition temperature is reduced from 920° C. to 850° C. during a time of 10 min. As a result, a phase-gradient layer having a thickness of approximately 1 μm is formed, which consists of the phases TiN, h-AlN, and fcc-$Ti_{1-x}Al_xN$. This phase-gradient layer demonstrates great adhesion strength both with regard to the lower TiN layer and to the subsequent fcc-$Ti_{1-x}Al_xN$ cover layer.

In the third process step, an fcc-$Ti_{1-x}Al_xN$ layer having a thickness of 3 μm is then applied, at 850° C. and an unchanged composition of the gas mixture.

The composition of the phase-gradient layer was determined by means of X-ray thin-layer analysis, with grazing incidence. The results can be seen in the X-ray diffractogram according to FIG. 1. In this connection, the change in the phase composition with an increasing layer thickness was detected by means of measurements at different incidence angles. The measurement took place at three incidence angles. At the smallest incidence angle of 1°, only the uppermost TiAlN layer is irradiated. The phase that occurs in the diffractogram is pure fcc-$Ti_{1-x}Al_xN$. At an incidence angle of 5°, the region of the gradient layer that lies underneath is also detected. Reflections of fcc-$Ti_{1-x}Al_xN$, h-AlN, and TiN, along with first reflections of the substrate WC/Co, can be seen. At an angle of 10°, the X-ray radiation penetrates through the entire layer system and regions of the substrate. In the diffractogram, both the reflections of fcc-$Ti_{1-x}Al_xN$, h-AlN, and TiN, as well as those of the substrate can be seen.

It was possible to demonstrate an improvement in the layer adhesion using the scratch test. For a conventional two-layer system of TiN and fcc-$Ti_{1-x}Al_xN$, without phase-gradient layer, a critical load of 60 N was measured. In comparison with this, the three-layer system according to the invention, with phase-gradient layer, achieves a critical load of 100 N and therefore demonstrates clearly greater adhesion strength.

The layer system according to the invention possesses an increased friction-wear resistance in comparison with TiAlN layers that were produced according to the state of the art. When milling steel 42 Cr Mo 4 V (cutting speed $v_c$=250 m/min, cutting depth $a_p$=2 mm, advance f=0.25 mm), a cutting lifetime of 4000 mm was determined for a CVD two-layer system composed of 1 μm TiN and 3 μm TiAlN. Another PVT-TiAlN layer system corresponding to the state of the art achieved a cutting lifetime of 10,000 mm. The layer system according to the invention, with integrated phase-gradient layer, demonstrated the greatest friction-wear resistance and achieved a cutting lifetime of 12,000 mm, on average.

The invention claimed is:

1. Hard-material-coated bodies having a multi-layer layer system that contains a bonding layer of TiN, Ti(C,N), or TiC applied to the body, and at least one monophase or multiphase $Ti_{1-x}Al_xN$ hard-material layer, comprising a phase-gradient layer that is present between the bonding layer and the hard-material layer, which consists of a TiN/h-AlN phase mixture on its side that faces the bonding layer, and demonstrates an increasing phase proportion of fcc-TiAlN having a proportion of >50% in the direction toward the $Ti_{1-x}Al_xN$ hard-material layer(s), with an increasing layer thickness, and an accompanying simultaneous decrease in the phase proportions of TiN and h-AlN.

2. Hard-material-coated bodies according to claim 1, wherein the multiphase $Ti_{1-x}Al_xN$ hard-material layers contain fcc-$Ti_{1-x}Al_xN$ as the main phase, whereby $Ti_{1-x}Al_xN$ in the wurtzite structure and/or TiN are contained as additional phases.

3. Hard-material-coated bodies according to claim 1, wherein the phase-gradient layer has a constant or almost constant content of Ti, Al, and N over its thickness.

4. Hard-material-coated bodies according to claim 1, wherein the layer thickness of the phase-gradient layer amounts to 0.1 μm to 5 μm.

5. Hard-material-coated bodies according to claim 1, wherein the atomic ratio of Ti:Al in the phase-gradient layer lies in the range of 1:1 to 1:15.

6. Method for the production of hard-material-coated bodies according to claim 1, wherein first, a bonding layer of TiN, Ti(C,N), or TiC is applied to the body, using an industrial CVD standard process, then the phase-gradient layer is deposited onto this, and finally, in known manner, one or more monophase or multiphase $Ti_{1-x}Al_xN$ hard-material layers are deposited onto this, by means of CVD, without plasma excitation, whereby the deposition of the phase-gradient layer is carried out with a CVD process, with a continuously dropping process temperature, using a precursor mixture of $TiCl_4$, $AlCl_3$, $NH_3$ and/or hydrazine, mixed with $H_2$ and/or $N_2$.

7. Method according to claim 6, wherein the CVD process for deposition of the phase-gradient layer is started at a starting temperature between 900° C. and 1050° C. and wherein the process temperature is continuously lowered, during the course of the deposition process, to a final temperature between 700° C. and 890° C.

8. Method according to claim 6, wherein the CVD process for deposition of the phase-gradient layer is carried out during a time of 1 min to 60 min.

9. Method according to claim 6, wherein inert rare gases are additionally mixed into the precursor/gas mixture for deposition of the phase-gradient layer.

10. Method according to claim 6, wherein the CVD process for deposition of the phase-gradient layer is carried out at a pressure of $10^2$ Pa to $10^5$ Pa.

* * * * *